United States Patent [19]
Atoji

[11] Patent Number: 5,876,497
[45] Date of Patent: Mar. 2, 1999

[54] FABRICATION PROCESS AND FABRICATION APPARATUS OF SOI SUBSTRATE

[75] Inventor: Tadashi Atoji, Machida, Japan

[73] Assignee: Canon Kabushiki Kaisha, Tokyo, Japan

[21] Appl. No.: 762,595

[22] Filed: Dec. 9, 1996

[30] Foreign Application Priority Data

Dec. 12, 1995 [JP] Japan .................................. 7-322921
Dec. 5, 1996 [JP] Japan .................................. 8-325106

[51] Int. Cl.⁶ .................................................. C30B 25/22
[52] U.S. Cl. .............................. 117/85; 117/93; 117/94; 117/97
[58] Field of Search .................. 117/94, 97, 93, 117/85

[56] References Cited

U.S. PATENT DOCUMENTS 5,371,037  12/1994  Komehara et al. ........................ 437/86
5,427,052   6/1995  Ohta ........................................ 117/85
5,445,992   8/1995  Tokunaga et al. ...................... 437/100

FOREIGN PATENT DOCUMENTS 0554795A  8/1992  European Pat. Off. ........ H01L 21/84
0528229A  2/1993  European Pat. Off. ........ H01L 21/76

OTHER PUBLICATIONS

K. Sakaguchi, et al, "Exytremely High Selective Etching of Porous Si For Single Etch–Stop Bond–and–Etch–Back SOI", Int'l.Conf. on Solid State Devices and Materials, Aug. 23, 1994, pp. 259–261.

L. Vescan et al., "Low–Pressure Vapor–Phase Epitaxy of Silicon On Porous Silicon", Sep. 1988,Materials Letters, vol. 7, No. 3 pp. 94–95.

Nobuhiko Sato et al., "Epitaxial Growth On Porous Si For a New Bond and Etch–Back SOI", 1994, Proceedings of the International Symposium on Silicon Materials Science and Technology, pp. 443–453.

*Primary Examiner*—Robert Kunemund
*Attorney, Agent, or Firm*—Fitzpatrick, Cella, Harper & Scinto

[57] ABSTRACT

The conventional fabrication processes of SOI substrate employed wet etching for removing a porous single-crystal Si region, but wet etching involved difficulties in management of concentration for fabricating SOI substrates in high volume, which caused reduction in productivity.

Therefore, provided is a fabrication process of SOI substrate comprises a step of forming a non-porous single-crystal Si region on a surface of a porous single-crystal Si region of a single-crystal Si substrate having at least the porous single-crystal Si region, a step of bonding a support substrate through an insulating region to a surface of the non-porous single-crystal Si region, and a step of removing the porous single-crystal Si region, wherein the step of removing the porous single-crystal Si region comprises a step of performing dry etching in which an etch rate of the porous single-crystal Si region is greater than that of the non-porous single-crystal Si region.

6 Claims, 6 Drawing Sheets

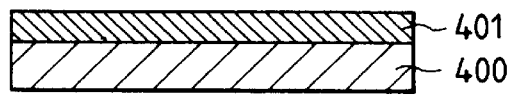
FIG. 4A
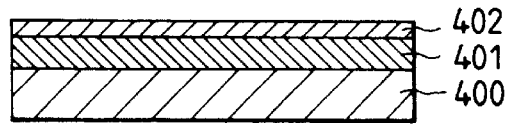
FIG. 4B
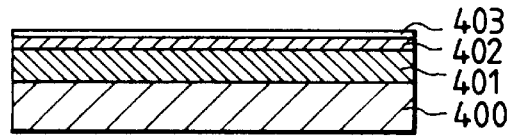
FIG. 4C
FIG. 4D
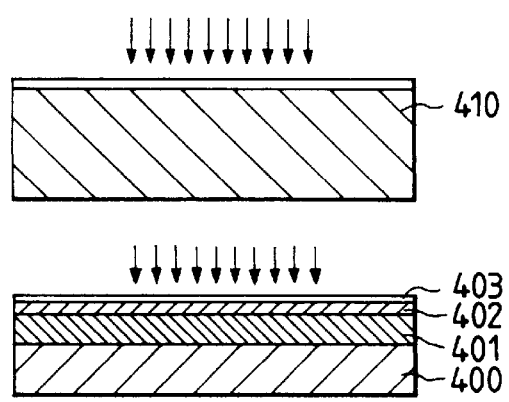
FIG. 4E
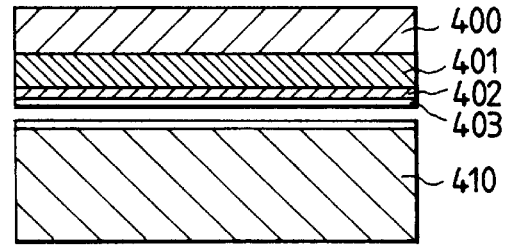
FIG. 4F
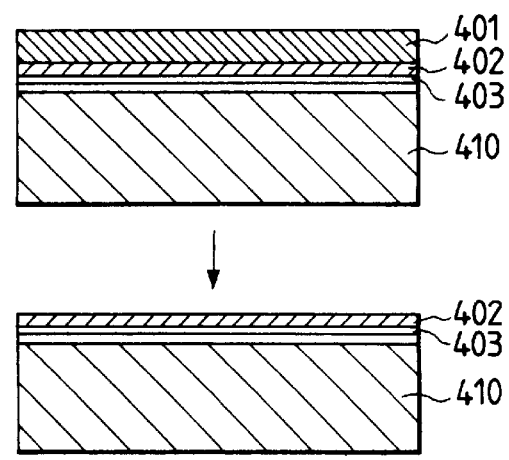

FABRICATION PROCESS AND FABRICATION APPARATUS OF SOI SUBSTRATE

BACKGROUND OF THE INVENTION

1. Field of the Invention

The present invention relates to a fabrication process and fabrication apparatus of SOI substrate excellent in uniformity of film thickness and in suppression of vacancy of film (or voids) and interface states, and more particularly, to a fabrication process and fabrication apparatus of SOI substrate applied to high-functionality and high-performance electronic devices, highly integrated circuits, and so on, fabricated in a single-crystal semiconductor layer on a transparent insulator substrate of glass or the like or on a silicon substrate with an oxide film thereon.

2. Related Background Art

Formation of a single-crystal silicon semiconductor layer on an insulator is widely known as the Silicon on Insulator (SOI) technology, and many researches have been conducted because this substrate has a lot of advantages that cannot be achieved by bulk silicon substrates used for fabricating ordinary silicon integrated circuits.

[SOS and SIMOX]

One of the conventional SOI technologies is the so-called SOS (Silicon-On-Sapphire), which is the technology for hetero-epitaxially growing a silicon layer on a sapphire crystal, but the quality of the hetero-epitaxially grown silicon crystal is poor. Also, SIMOX (Separation-by-IMplanted-OXygen) is under practical use as an SOI forming technology for implanting a lot of oxygen ions into silicon and thereafter subjecting the resultant to annealing, thereby forming an $SiO_2$ layer with implanted oxygen being buried from the surface of silicon to the position of about 0.2 $\mu$m. However, this implantation of many oxygen ions and annealing requires a lot of time, which is disadvantageous in respect of productivity and cost, and the ion implantation causes many crystal defects in the SOI silicon layer. Decreasing implantation of oxygen ions would make it difficult at present to maintain the film quality of the oxide layer, and it is also considered to be difficult to change the thickness of the implant $SiO_2$ film layer.

[Bonding SOI]

Among the SOI forming techniques reported recently, there is "bonding SOI," popularly called, particularly excellent in quality. This is the technology in which mirror surfaces of two wafers at least one of which has an insulating film formed by oxidation or the like are brought into close adhesion with each other, they are subjected to annealing so as to reinforce coupling of adhesion interface, and thereafter the substrate is polished or etched from either one side so as to leave a silicon single-crystal thin film having an arbitrary thickness on the insulator film. The most important point in this technology is a step for thinning the silicon substrate into a thin film. In more detail, normally, the silicon substrate as thick as several hundred $\mu$m or so needs to be polished or etched uniformly down to the thickness of several $\mu$m or even 1 $\mu$m or less, which is technologically very difficult in respect of controllability and uniformity. There are roughly two ways for thinning silicon into a thin film. One of them is a method for carrying out thinning only by polishing (BPSOI: Bonding and Polishing SOI), and the other is a method for providing an etching stop layer immediately over a thin film to be left (actually, immediately under the thin film during fabrication of single substrate) and performing two stages of substrate etching and etching of the etching stop layer (BESOI: Bond and Etchback SOI). Since in the BESOI a silicon active layer is often epitaxially grown over the etching stop layer preliminarily formed, this BESOI is considered to be advantageous so far in order to secure uniformity of film thickness. However, since the etching stop layer often contains a high concentration of impurities, it will cause distortion of crystal lattice, which will result in the problem that the crystal defects propagate to the epitaxial layer. There is also a possibility that the impurities diffuse upon oxidation of the epitaxial layer or upon annealing after bonding, thereby changing etching characteristics.

In these bonding SOIs, if there are contaminations in the bonding surfaces or if there are asperities because of poor flatness of the bonding surfaces, many vacant spaces called "voids" will appear at the bonding interface. From this point the BESOI discussed above is disadvantageous in many cases. The reason is as follows. The etching stop layer is normally formed, for example, by hetero-epitaxial growth by CVD or by epitaxial growth with doping of a high concentration of impurities. In the case of CVD, especially in the case of the hetero-epitaxial growth, the flatness achieved is often inferior to that of flat surfaces obtained by polishing. The etching stop layer is sometimes formed by ion implantation, but the flatness is also degraded in this case.

[New BESOI technology]

An example of the technology for achieving good flatness of the bonding surfaces, uniform film thickness of the active layer as in the BESOI, and selectivity of etchback several orders of magnitude higher than that in the conventional BESOI is the technology for making the surface of silicon substrate porous by anodization and epitaxially growing the silicon active layer thereon (Japanese Laid-open Patent Application No. 5-21338). In this case, the porous layer corresponds to the etching stop layer in the BESOI. However, since the etch rate of porous silicon is very high with a hydrofluoric acid based etchant as compared with single-crystal silicon, a high-selectivity etching characteristic is considered to be more important rather than the etching stop layer. Since this technology forms the porous silicon layer not by CVD, but by anodization of a flat single-crystal silicon substrate surface, the flatness of the epitaxially grown active layer becomes better than that in the BESOI in which the etching stop layer is formed by CVD or the like. The epitaxial layer growing on this surface has a property of achieving crystallinity nearly equal to that of an epitaxial layer grown on a non-porous single-crystal substrate. This enables us to use a single-crystal thin film equivalent to the epitaxial layer on the single-crystal silicon substrate with high reliability as an active layer, thus providing the SOI substrates with excellent crystallinity and with excellent uniformity of film thickness.

K. Sakaguchi et al. reported that a substrate obtained by anodizing the surface of silicon single-crystal substrate to make it porous and effecting epitaxial growth thereon was bonded to a silicon substrate with an oxidized surface, the non-porous single-crystal silicon substrate portion was ground by a grinder to expose the porous layer, and only the porous layer was selectively etched with solution of $HF/H_2O_2$ mixture, thus achieving 507 nm ±15 nm (±3%) or 96.8 nm ±4.5 nm (±4.7%) as a film thickness distribution of SOI silicon layer for 5-inch wafers. It is described that in the etching with the solution of $HF/H_2O_2$ mixture in this case the etch rate of the porous silicon layer is $10^5$ times greater than that of the non-porous silicon layer, and thus, the porous silicon layer functions well as an etching stop layer in the BESOI.

In addition to the method for bonding a single-crystal silicon substrate having a thermally oxidized surface or a transparent silica glass substrate to an epitaxial silicon film grown on this porous silicon, it is also possible to bond $SiO_2$ surfaces of two substrates to each other. The interface state density of the interface between the epitaxial silicon film as an active layer and $SiO_2$ (the thermally oxidized film of the epitaxial layer) is sufficiently low, and the thickness of the $SiO_2$ layer can be controlled arbitrarily. Thus, the substrate can be fabricated as making full use of the characteristics of SOI. Then the surface of $SiO_2$ at the bonding interface is activated by a plasma process, whereby the bonding strength can be enhanced fully and occurrence of voids can be suppressed.

The new BESOI technology described above permits us to obtain high-quality SOI substrates in which by the high selective etching of porous Si region the film thickness distribution preserves the flatness and film thickness distribution upon epitaxial growth. However, the above new BESOI technology has the following problem in removing the porous Si region.

Since wet etching is carried out using a hydrofluoric acid based etchant of wet type upon removing the porous Si region, liquid exchange upon processing of many substrates and controllability of etchant concentration management are not easy, so that productivity is so poor.

Therefore, formation and etching of porous silicon takes a lot of time.

SUMMARY OF THE INVENTION

It is, therefore, an object of the present invention to realize a fabrication process and fabrication apparatus of SOI substrate overcoming the problem of the decrease in productivity because of management of concentration of etchant or the like using the hydrofluoric acid based etchant of wet type for removing the porous Si region.

In order to achieve the above object, the present inventor has made all possible efforts to achieve the following invention. Namely, the fabrication process of SOI substrate according to the present invention is a fabrication process of SOI substrate comprising a step of forming a non-porous single-crystal Si region over a surface of a porous single-crystal Si region of a single-crystal Si substrate having at least the porous single-crystal Si region, a step of bonding a support substrate through an insulating region to a surface of said non-porous single-crystal silicon region, and a step of removing said porous single-crystal Si region, wherein the step of removing said porous single-crystal Si region has a step of performing dry etching in which an etch rate of the porous single-crystal Si region is greater than that of the non-porous single-crystal Si region. Here, the step of removing the porous single-crystal Si region is preferably a step in which activated radical species generated by decomposition by at least electrical or optical energy intrude into pores of the porous region to start etching from inside thereof. Also, the step of removing the porous single-crystal Si region preferably has a step of heating or vibrating the etching substrate.

In the case of the porous single-crystal Si region being formed only on the surface of the single-crystal Si substrate, the process needs a step of removing a non-porous region of the single-crystal Si substrate before removing the porous single-crystal Si region. A preferable means for removing this non-porous region is grinding by a grinder or the like, or dry etching in which the etch rate of the non-porous single-crystal Si region is greater than that of the porous single-crystal Si region, as discussed hereinafter. The non-porous region of the single-crystal Si substrate may be removed by applying stress such as shear stress or tensile stress to separate the substrate at the porous single-crystal Si region. In this case, the porous single-crystal Si region remains on the non-porous single-crystal Si region, and it is removed by the process of the present invention. When the entire single-crystal Si substrate is made porous, there remains no non-porous region, and there is thus no need to perform the step of removing the non-porous region.

The present invention also involves the fabrication apparatus of SOI substrate. Namely, the fabrication apparatus of SOI substrate of the present invention is an in-line apparatus comprising:

a chamber for carrying out a step of bonding a first substrate obtained by making a surface layer of a silicon single-crystal substrate porous by anodization and forming a silicon single-crystal thin film layer on the porous surface by epitaxial growth, to a second substrate with $SiO_2$ in a surface thereof in close adhesion in an appropriate ambiance;

a chamber for carrying out an annealing step for reinforcing adhesion force of the bonded substrates;

a chamber for carrying out a first selective dry etching step of removing a non-porous single-crystal substrate portion of said first substrate in close adhesion; and a chamber for carrying out a second selective dry etching step of removing said porous silicon portion, wherein the all foregoing chambers are connected as being shut off from the outside ambiance by a vacuum evacuation device.

Here, the chamber for carrying out the step of bonding the first substrate obtained by making the surface layer of the silicon single-crystal substrate porous by anodization and forming the silicon single-crystal thin film layer on the porous surface by epitaxial growth, to the second substrate with $SiO_2$ in the surface thereof in close adhesion in the appropriate ambiance is preferably arranged in such structure that a gas containing O atoms and H atoms for properly forming OH bonds at the bonded surfaces can be introduced into the chamber and that the chamber is separated into a section for activating the bonded surfaces by optical or electric energy and a section capable of being evacuated to a high vacuum for eliminating impurities and contaminations in the bonded surfaces.

The chamber for carrying out the selective dry etching step of the non-porous single-crystal substrate portion on the first substrate side is preferably a reactive ion etching chamber having an electrode capable of supplying RF (radio frequency) power for ionizing gas molecules in the form of a capacitive coupled plasma.

The reactive ion etching chamber is preferably arranged to have a mechanism capable of applying a DC electric field for promoting the surface reaction of ions.

The reactive ion etching chamber is preferably arranged to have means for performing determination of an end point of etching based on a change of a self-bias at the time when the porous silicon portion is exposed over the entire surface.

The chamber for carrying out the selective dry etching step of the porous silicon portion is preferably a radical etching chamber arranged to be separated into a section for supplying optical or electric energy to decompose the gas molecules, thereby forming radicals, and a section to which the radicals are transported to intrude into the pores of the porous layer of the etched substrate so as to start etching from inside thereof.

The radical etching chamber is preferably arranged to have a substrate heating mechanism for promoting diffusion of the radicals into the pores of the porous layer.

The radical etching chamber is preferably arranged to have a substrate vibrating mechanism for promoting diffusion of the radicals into the pores of the porous layer.

The point of the fabrication apparatus of the present invention resides in the etching characteristics of porous silicon and non-porous silicon and in that the etching techniques with opposite etch selectivities can be carried out alternately by dry etching excellent in productivity instead of the conventional wet etching and can be implemented as an in-line apparatus.

First, the present invention clarified the etching mechanism of porous silicon, whereby it was found that such etch selectivity characteristics that the etch rate of porous silicon was very fast similarly as in the wet etching were able to be attained by selecting appropriate etching conditions even in the dry etching. This etching mechanism is considered as follows.

In porous silicon several-ten-to-hundred-angstrom pores exist in high density from the surface to the inside. Radicals to be involved in etching as intruding into the pores attach to walls of the pores, and start etching from the side walls. Then pillars in the pillar structure become thinner and thinner, so that the porous silicon portion finally disintegrates from the inside so as to be removed. On the other hand, since non-porous silicon includes no pores, etching occurs only at the surface thereof. Supposing that the radicals to be involved in etching intruded into the pores of porous silicon up to the depth of several ten $\mu$m to attach thereto during a period of several-ten-angstrom etching of the non-porous surface, for example, the surfaces of the walls of the pores would also be etched by same amounts, so that the pillars in the portions for the radicals to intrude through the pores would disintegrate so as to result in several-ten-$\mu$m etching of porous silicon.

The significant point herein is that the rates for the radicals involved in etching to intrude and attach to the pores of porous silicon are sufficiently greater than the etch rate of the surface. Therefore, the point of the present invention is that the etching to remove this porous silicon is in a chemical, radical etching mode, in which etching is effected only by diffusion of the radicals involved in etching into the pores. The reactive ion etching, RIE, with anisotropy in the direction of an electric field is not used as the etching herein, because it promotes etching of the surface more. First, the etching gas species are decomposed by electric or optical energy, and thereafter the second-order reaction occurs in the vapor phase in the transport process so as to yield further stabler and longer-lifetime etching radicals, which reach the etching substrate. When the substrate is further heated or vibrated upon etching, it promotes isotropic diffusion of the radicals to stabler sites and thus promotes intrusion of the radicals into the pores of porous silicon, whereby the etch rate of porous silicon can be achieved at the selectivity $10^5$ to $10^6$ times greater than that of non-porous silicon.

The inventor found the etching conditions with the completely opposite selectivity, unobtainable in the conventional wet etching, under which in selective removal of the non-porous single-crystal substrate portion, the etch rate of porous silicon is several or more times slower than the etch rate of non-porous silicon, depending upon the conditions. The mechanism of etching with the completely opposite etch selectivity of porous silicon and non-porous silicon has not been clarified yet completely, but it may be considered as follows.

The point of the present invention is that in the selective etching of the non-porous silicon portion herein, completely opposite to the aforementioned selective etching of porous silicon, the etch rate of the surface is equal to or higher than the rate of intrusion of radicals or the like. Therefore, etching of the surface can be advanced more by using the reactive ion etching mode with anisotropy in the direction of the electric field, such as RIE, herein. Further, because the surface of porous silicon is oxidized or because the density thereof is low, the DC electric field component of porous silicon in the ion etching mode is different from that of non-porous silicon, whereby the etch rate of porous silicon is conceivably lowered.

In order to promote the surface etching in this ion etching mode, a method for applying a DC bias from the outside is effective in addition to increasing the self-bias by properly selecting the pressure, power, etching gas, etc. in RF plasma discharge. Application of 100 to several 100 V makes the etch rate of porous silicon about several to several ten times slower than that of non-porous silicon. This results in partially exposing underlying porous silicon because of the thickness distribution of wafer and the etching thickness distribution, when removing the non-porous wafer portion after bonded, but because the etch rate of that portion is slow, a distribution of remaining thicknesses of porous silicon is relaxed, thus improving uniformity.

Since the selectivity of etch rate and the uniformity of in-plane distribution of etch rate are sufficiently high, time control is enough to determine the end point of etching at the time when the non-porous silicon substrate portion is etched to expose the porous silicon portion throughout the entire surface. However, an apparatus, designed as taking account of productivity more, can be arranged to monitor the self-bias in order to determine the end point. Namely, the end point can be surely determined because the self-bias is lowered at the time of exposure of porous silicon.

The present invention has solved the problem of very poor productivity due to the difficulties in liquid exchange after processing of many substrates and in controllability of etchant concentration management in use of the conventional hydrofluoric acid based etchant or alkali based etchant of wet type for removing the porous Si region.

BRIEF DESCRIPTION OF THE DRAWINGS

FIGS. 4A, 4B, 4C, 4D, 4E and 4F are schematic cross-sectional views for explaining steps in the fourth example of the present invention;

DETAILED DESCRIPTION OF THE PREFERRED EMBODIMENTS

An embodiment of the present invention will be explained with reference to FIGS. 1A to 1F.

Figure 6A:
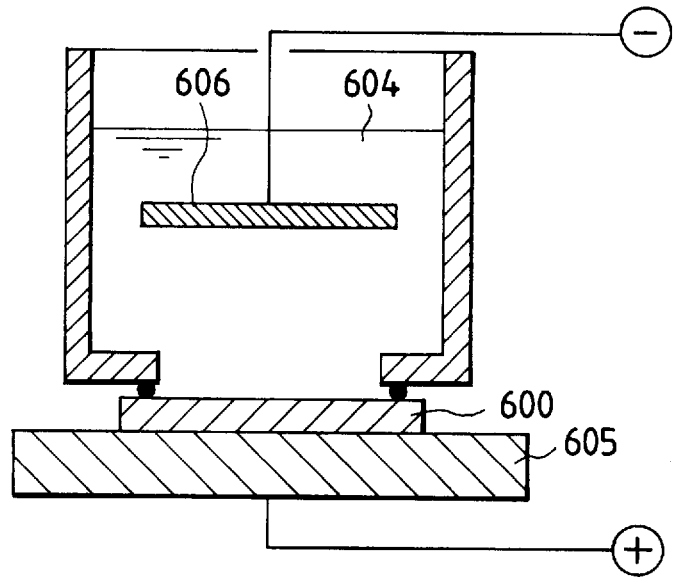
FIGS. 6A and 6B are schematic cross-sectional views of an apparatus for making a silicon substrate porous.
Figure 6B:
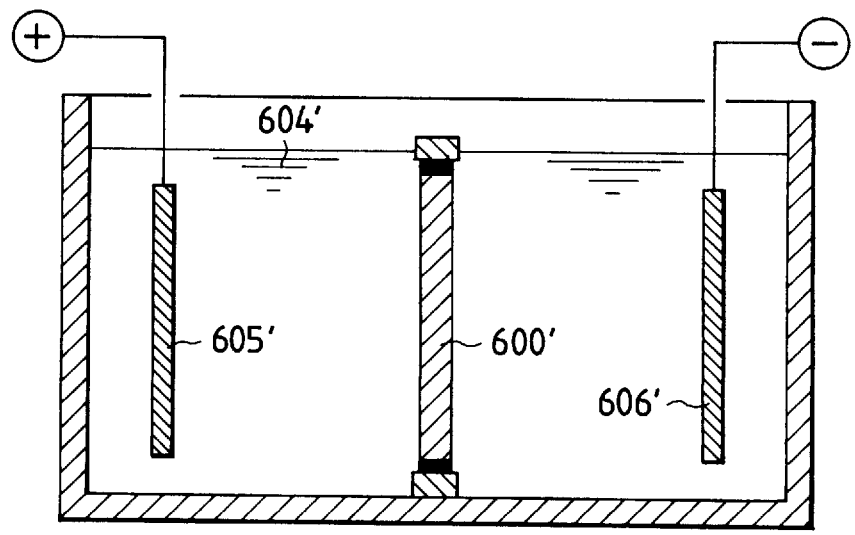

(FIG. 1A) A single-crystal silicon substrate 100 is anodized to form porous silicon 101. The thickness of the porous layer at this time may be between several μm and several ten μm of the one-side surface layer of substrate. It is also noted that the entire substrate may be anodized. The method for forming porous silicon will be explained referring to FIGS. 6A and 6B. First, a p-type single-crystal silicon substrate 600 is prepared as a substrate. N-type is not impossible, but it is limited to low-resistance substrates or anodization must be carried out in such a state that generation of holes is promoted by irradiating the surface of substrate with light. The substrate 600 is set in the apparatus as shown in FIG. 6A. Namely, one side of the surface is in contact with hydrofluoric acid based solution 604, a negative electrode 606 is set on the solution side, and the other side of the substrate is in contact with a positive metal electrode 605. As shown in FIG. 6B, positive electrode side 605' may be also arranged at a potential through solution 604'.

In either case formation of porous layer starts from the negative electrode side in contact with the hydrofluoric acid based solution. The hydrofluoric acid based solution 604 is normally conc hydrofluoric acid (49%HF). As the hydrofluoric acid solution is diluted with pure water ($H_2O$), etching starts from a certain concentration, though depending upon a value of current flowing, which is not preferred. In some cases bubbles occur from the surface of the substrate 600 during anodization and alcohol is thus added as a surfactant in order to remove the bubbles efficiently. Alcohols applicable are methanol, ethanol, propanol, isopropanol, and the like. Using a stirrer instead of the surfactant, anodization may be carried out with stirring the solution.

The negative electrode 606 is made of a material that is not corroded by the hydrofluoric acid solution, for example, gold (Au), platinum (Pt), and the like. A material for the positive electrode 605 may be selected from normally used metal materials, but, because the hydrofluoric acid based solution 604 will reach the positive electrode 605 after completion of anodization of the entire substrate 600, the surface of the positive electrode 605 should better be coated with a metal film resistant to the hydrofluoric acid solution. The value of the current for anodization may be selected in the range of the maximum of several hundred $mA/cm^2$ to the minimum of more than zero. This value is determined within the range that permits good-quality epitaxial growth on the surface of porous silicon. Normally, with increasing the current value, the rate of anodization increases and the density of the porous silicon layer decreases. Namely, the volume occupied by pores increases. This changes the conditions of epitaxial growth.

(FIG. 1B) A non-porous single-crystal silicon layer 102 is epitaxially grown over the porous layer 101 formed as described above. The reason why the epitaxial growth is possible is that the porous layer 101 is of a single crystal. The epitaxial growth is carried out by ordinary thermal CVD, low pressure CVD, plasma CVD, molecular beam epitaxy, sputtering, or the like. The film thickness of the thus grown layer may be determined to be the same as a design value of the SOI layer, but the film thickness is preferably not more than 2 μm. The reason is as follows. If a single-crystal Si film 2 or more μm thick exists on the insulating substrate mainly containing $SiO_2$, great stress will occur at the bonding interface upon annealing thereof in device processes because of a difference of thermal expansion coefficients between the two materials, which will cause breakdown of the silicon film, curvature of the substrate, peeling-off at the interface, or the like. Since the stress is relatively small with the film thickness being not more than 2 μm, breakdown of film, peeling-off, curvature, etc. are unlikely to occur in that case. More preferably, the film thickness is not more than 0.5 μm. This is because with film thicknesses of not less than 0.5 μm slip lines become likely to occur on the crystal in fine regions, though peeling-off, breakdown, etc. will not occur, upon annealing in the subsequent processes.

The non-porous single-crystal Si layer 102 may be formed by closing the pores in the surface of the porous Si layer 101 by annealing.

(FIG. 1C) The surface of the epitaxial layer 102 is oxidized (103). This is necessary because, in case of the epitaxial layer being bonded directly to a support substrate in the next step, impurities would segregate easily at the bonding interface and non-coupling bonds (dangling bonds) of atoms at the interface would increase, which would be factors to make characteristics of thin film devices unstable.

The sufficient thickness of the oxide film may be determined within such a range as not to be affected by contaminations taken from the atmosphere into the bonding interface.

(FIG. 1D) Prepared are the above substrate 100 having the epitaxial surface with the oxidized surface and the support substrate 110 having $SiO_2$ in the surface. Specific examples of the support substrate 110 include a silicon substrate the surface of which is oxidized, silica glass, crystallized glass, $SiO_2$ deposited on an arbitrary substrate, and so on.

Then these two substrates, or one of them is exposed to a plasma ambiance to activate $SiO_2$ in the surface. Gas used at this time is preferably oxygen, but in addition thereto, possibly applicable gases are the air (mixture of oxygen and nitrogen), nitrogen, hydrogen, inert gas such as argon or helium, gas of molecules of ammonia or the like, and so on.

(FIG. 1E) The two substrates prepared in the above step are cleaned and thereafter bonded to each other. A preferable cleaning method is just rinsing with pure water, and examples of other solutions applicable include a solution of hydrogen peroxide diluted with pure water, and a solution of hydrochloric acid or sulfuric acid diluted with sufficient pure water.

Pressing the entire surfaces of the substrates after bonded has an effect to enhance the strength of junction.

Then the bonded substrates are annealed. The annealing temperature is preferably as high as possible, but too high temperatures would cause structural change of the porous layer 101 or diffusion of impurities contained in the substrate into the epitaxial layer. It is, therefore, necessary to select the temperature and time not causing these. Specifically, preferable temperatures are not more than 1200° C. Further, some substrates are not resistant to annealing at high temperatures. For example, in the case of the support substrate 110 being silica glass, annealing must be conducted at temperatures of not more than approximately 200° C. because of the difference of thermal expansion coefficients between silicon and silica. At the temperatures over it the bonded substrates will be peeled off or broken because of stress. It is, however, noted that annealing is sufficient as long as the interface can resist grinding of bulk silicon 100 and stress upon etching in the next step. Therefore, the process can be performed even at temperatures of not more than 200° C. by optimizing the surface treatment conditions for activation.

(FIG. 1F) Next, the silicon substrate portion 100 and porous portion 101 are selectively removed as leaving the epitaxial layer 102.

First, the non-porous silicon substrate portion 100 is partly ground by a surface grinder or the like and thereafter is etched by RIE, or the entire silicon substrate portion 100 is removed by RIE without grinding.

As for the etching of the non-porous silicon substrate portion herein, the point of the present invention is that the etch rate of the surface is equal to or greater than the intrusion rate of radicals or the like. Therefore, using the reactive ion etching mode having anisotropy in the direction of the electric field, such as RIE, etching of the surface can be advanced more. Further, because the surface of porous silicon is oxidized or because the density thereof is small, the DC electric field component in the ion etching mode varies between non-porous and porous silicon, whereby the etch rate of porous silicon is conceivably lowered.

In order to promote the surface etching in this ion etching mode, it is necessary to properly select the pressure, power, etching gas, and so on in RF plasma discharge. The reactive ion etching is carried out in such a way that etching gas, such as $H_2$ gas, or $CF_4$ or $SF_6$ containing F atoms, is mixed with carrier gas such as $O_2$ or $N_2$ gas or inert gas such as He or Ar, it is decomposed by a plasma obtained by RF or microwave power or by energy of light, and activated ions reach the surface of the etched substrate as accelerated in the direction of the electric field, thus etching the surface.

In setting of discharge conditions it is important to facilitate achievement of ionization energy, especially, by setting the discharge pressure low to ensure a long mean free path of gas molecules. Greater RF power will increase the DC bias component between the electrodes to promote ion etching, but on the other hand, it also promotes the radical decomposition reaction, so that the radical etching mode is also mixed. Therefore, care is needed in that case. In addition to increasing the self-bias by RF power, a method for applying a DC bias from the outside is also effective. Application of 100 to several 100 V enhances the etch rate of non-porous silicon, and even etching of several 100 $\mu$m will be completed within several hours. The etch rate of porous silicon at that time is approximately several to several ten times slower. Therefore, in removing the non-porous wafer portion after bonding, underlying porous silicon is partially exposed because of the thickness distribution of wafer and the etching thickness distribution, but because the etch rate of that portion is slow, the distribution of thicknesses of remaining porous silicon is relaxed, thus improving uniformity. A plasma utilizing magnetron or ECR plasma is also effective for further promoting the ion etching.

When the porous portion 101 is exposed after etching the non-porous silicon substrate portion 100, etching is stopped once. Determination of the end point of etching at this time may be made well by time control because of sufficient selectivity of etch rate and sufficient in-plane distribution uniformity of etch rate, but it can also be made by monitoring the self-bias. Namely, the determination of end point can be surely made because the self-bias drops when the porous silicon is exposed.

The non-porous Si substrate may be removed by exerting shear stress or tensile stress on the bonded substrates. In this case, reuse of the non-porous Si substrate 100 becomes possible.

Next, the underlying porous portion 101 is etched by radical etching. In porous silicon there are several-ten-to-hundred-angstrom pores in high density from the surface to the inside, and the radicals intruding into the pores and involved in etching adhere to the walls of the pores to start etching from the side walls and to thin pillars in the pillar structure, whereby the porous silicon portion finally disintegrates to be removed. On the other hand, non-porous silicon has no pores, and thus, only etching of its surface occurs. For example, supposing that the radicals involved in etching intruded up to the depth of several ten pm and attached to the pores of porous silicon during several-ten-angstrom etching of the non-porous surface, the walls of the pores would also be etched by the same quantities as the surface, so that the pillars in the portions where the radicals intruded through the pores would disintegrate, thus effecting several-ten-$\mu$m etching of porous silicon.

The important point herein is that the rates at which the radicals involved in etching intrude and attach to the pores of porous silicon are sufficiently greater than the etch rate of the surface. Accordingly, the point of the present invention herein is that the etching to remove porous silicon is in the chemical, radical etching mode in which etching is effected only by diffusion of the radicals involved in etching into the pores and etching proceeds isotropically. Since the reactive ion etching having anisotropy in the direction of the electric field, such as ordinary RIE, advances etching of the surface more, it is not used as the etching herein. It is, however, noted that the etching herein can be realized even in an etching apparatus of RIE by selecting appropriate conditions for gas, flow rate, pressure, and so on. The discharge conditions need to be set, especially, so as to keep the discharge pressure high to make the mean free path of gas molecules short and thereby promote the second-order reaction of ions and so as to keep the self-bias of the substrate low to make etching of surface by activated ions hardly occur. It is also effective to employ a method for applying a DC bias from the outside in the reverse direction to the self-bias or a method for positioning the etched substrate on the anode side of electrode, but it is difficult to suppress arrival of ions completely. Preferably, a radical generating section and an etching section are spatially separated from each other and a process to transport the radicals between them is provided.

Also, the etching gas such as $H_2$ gas, or $CF_4$ or $SF_6$ containing F atoms is mixed with the carrier gas such as $O_2$ or $N_2$ gas, it is decomposed into radicals by a plasma formed by RF or microwave power or by energy of light, and the second-order reaction with the carrier gas or the like takes place in the vapor phase in the transport process, thereby obtaining further stabler and longer-lifetime etching radicals. This is because the etching gas arrives on the etching substrate. Further, when the substrate is heated or vibrated upon etching, it promotes isotropic diffusion of the radicals to stabler sites, so that intrusion thereof into the pores of porous silicon is promoted, whereby the etch rate of porous silicon is attained at the selectivity $10^5$ to $10^6$ times greater than that of non-porous silicon. At this time, since the underlying epitaxial portion 102 is non-porous, the etch rate thereof is five to six orders of magnitude smaller than the etch rate of porous silicon, and etching rarely occurs, whereby the epitaxial layer 102 remains as a thin film as preserving the film thickness uniformity achieved upon epitaxial growth.

Further, the following steps may be added in some cases to the steps as described above.

(1) Oxidation of inner walls of pores in the porous layer (preoxidation)

The thicknesses of the walls between the adjacent pores in the porous Si layer are very small, several nm to several ten nm. This will sometimes cause the pore walls to cohere to each other during a high-temperature process of the porous layer, for example, upon formation of the epitaxial Si layer, upon annealing after bonding, or the like, and the pore walls become large and coarse so as to close the pores, thus lowering the etch rate. If a thin oxide film is formed on the pore walls after formation of the porous layer, the pore walls will be prevented from becoming large and coarse. However, since the non-porous single-crystal Si layer needs to be epitaxially grown on the porous layer, it is necessary to oxidize only the surfaces of the inner walls of the pores so as to leave single crystallinity inside the pore walls of the porous layer. The oxide films formed herein desirably have film thicknesses of several Å to several ten Å. The oxide films of such film thicknesses are formed by annealing at a temperature in the range of 200° C. to 700° C., more preferably at a temperature in the range of 250° C. to 500° C., in an oxygen ambiance.

(2) Hydrogen baking process

EP553852A2 showed that annealing under a hydrogen ambiance could remove fine roughness of Si surface so as to obtain a very smooth Si surface. The baking under the hydrogen ambiance can also be applied in the present invention. The hydrogen baking can be carried out, for example, after formation of the porous Si layer and before formation of the epitaxial Si layer. Separately from it, the hydrogen baking can be effected on the SOI substrate obtained after etching removal of the porous Si layer. The hydrogen baking process carried out before formation of the epitaxial Si layer causes a phenomenon that the outermost surfaces of the pores are blocked by migration of Si atoms constituting the porous Si surface. When the epitaxial Si layer is formed as the outermost surfaces of the pores are blocked, the epitaxial Si layer is obtained with less crystal defects. On the other hand, the hydrogen baking carried out after etching of the porous Si layer has an action to smooth the epitaxial Si surface roughened more or less by etching and an action to facilitate outward diffusion of boron having inevitably been taken from the air in the clean room into the bonding interface upon bonding and having diffused into the epitaxial Si layer and boron having thermally diffused from the porous Si layer to the epitaxial Si layer, so as to drive such boron out.

Execution of the above steps permit us to obtain the SOI substrate with a good film thickness distribution or the transparent insulating substrate with a single silicon crystal formed therein.

In a possible modification of the fabrication process of SOI substrate as described above, the surface of the non-porous single-crystal Si region 102 epitaxially grown is bonded to the Si wafer 110 having an oxide film without forming the oxide film 103 on the surface of the region 102. In anther possible modification, the oxide film is formed on the surface of the non-porous single-crystal Si region 102 and it is bonded to the Si wafer 110 without an oxide film.

EXAMPLES

[Example 1]

The first example of the present invention will be explained in detail with reference to FIGS. 1A to 1F and FIGS. 6A and 6B.

(FIG. 1A) A 6-inch p-type (100) single-crystal silicon substrate (0.1 to 0.2 Ωcm) approximately 300 μm thick was prepared, it was set in the apparatus as shown in FIG. 6A, and anodization was carried out to convert only 10 μm of the surface of silicon substrate 100 to porous silicon 101. The solution 604 at this time was 49% HF solution, and the current density was 100 mA/cm². The porous layer forming rate at this time was 5 μm/min and the porous layer 10 μm thick was obtained after two minutes.

(FIG. 1B) The single-crystal silicon layer 102 was epitaxially grown in the thickness of 0.25 μm on the porous silicon 101 by CVD. The deposition conditions were as follows.

Gas used: $SiH_4/H_2$
Flow rate of gas: 0.62/140 (1/min)
Temperature: 750° C.
Pressure: 80 Torr
Rate of growth: 0.12 μm/min (FIG. 1C) The substrate prepared by the above method was processed under the condition of 900° C. in a steam ambiance to obtain the oxide film 103 of 0.05 μm.

(FIG. 1D) The above substrate 100 having the oxide film, and the support substrate (silicon wafer) 110 with a silicon dioxide film 0.5 μm thick preliminarily prepared were set in a parallel plate plasma processing system, and the surfaces of the respective substrates were subjected to an activation process by an oxygen plasma. The process conditions were as follows.

RF frequency: 13.56 MHz
RF power: 400 W
Flow rate of oxygen: 30 sccm
Pressure: 20 Pa
Processing time: 1 minute Particular control of bias was not carried out between the plasma and the substrate, and the surface was processed only by the self-bias of the plasma.

(FIG. 1E) The both substrates surface-processed in the above step were immersed in pure water for five minutes, and after spin-dried, the processed surfaces thereof were bonded to each other. After that, annealing was carried out at 400° C. for six hours.

(FIG. 1F) After annealing, the non-porous single crystal substrate 100 was selectively etched in a parallel plate plasma etching system, similar to that described above, thereby exposing the porous silicon 101. The wafer bonded at this time had variation of thickness, and the porous silicon layer also had variation of thickness caused upon anodization, whereby the maximum variation of thickness of the non-porous single-crystal substrate portion 100 was approximately 300±5 μm. The etching conditions at this time were as follows.

RF frequency: 13.56 MHz
RF power: 1 kW
Flow rate of $SF_6$ gas: 1000 sccm
Flow rate of oxygen: 300 sccm
Pressure: 20 Pa
Substrate bias: 500 V
Processing time: 63 minutes The etch rate of non-porous silicon under the above conditions was 5 μm/min while that of porous silicon was 1 μm/min. If the non-porous single-crystal substrate portion 100 is as thin as about 295 μm in the worst case, it is overetched for three minutes; if it is as thick as 305 μm then it is overetched for one minute. The etching thicknesses of the underlying porous silicon 101 at this time are 4 μm and 2 μm, respectively, and thus, etching can be stopped in porous silicon 101 of 10 μm in the worst case. At this time no specific determination of end point was carried out, but for six substrates set in the etching system, the porous silicon layers of the all substrates were exposed over the entire surface in the processing time set, and in-wafer-plane distributions of remaining thicknesses thereof were within ±10%.

Then this substrate was set in a microwave-excited chemical dry etching system, and only the porous portion 101 was selectively etched. This system is spatially separated into a section for generating a plasma by microwave power and a section for carrying out etching, whereby the ion species will not reach the etching substrate. The etching conditions at this time were as follows.

Microwave frequency: 1 GHz

Microwave power: 100 W

Flow rate of $SF_6$ gas: 100 sccm

Flow rate of $O_2$: 500 sccm

Flow rate of $N_2$: 500 sccm

Pressure: 100 Pa

Processing time: 30 minutes

The etch rate of non-porous silicon under the above conditions was up to $5 \times 10^{-4}$ µm/min approximately. However, since etching first proceeded inside the pores of porous silicon, etching of the surface was not observed. The porous silicon layer started disintegrating suddenly approximately 20 minutes after start of etching, and was etched completely after 30 minutes from start. Variation of remaining thicknesses of porous silicon was approximately 6 to 8 µm in the worst case. Supposing that overetching of the underlying epitaxial single-crystal silicon layer 102 were of even about ten minutes in the etching of 30 minutes, overetching of single-crystal silicon would be not more than 50 Å, which would not affect the uniformity achieved upon epitaxial growth. The end point of etching can be determined utilizing a method for monitoring fluorescence from the etched surface, but control of etching time is sufficient because of the very large selectivity.

As a result, the SOI substrate was obtained with an excellent ultra-thin single-crystal silicon film having the film thickness distribution of about 180 µnm ±5.4 (±3%) on the silicon dioxide film of 0.6 µm.

[Example 2]

The second example of the present invention will be explained in detail with reference to FIGS. 2A to 2F.

(FIG. 2A) A 6-inch p-type (100) silicon substrate 200 with resistivity of 0.01 Ω·cm having the thickness of 300 µm was prepared, and only 10 µm of the surface layer thereof was converted into porous silicon 201 in the same manner as in the first example.

(FIG. 2B) An epitaxial layer 202 was formed in the thickness of 0.15 µm on the obtained porous surface in the same manner as in the first example.

(FIG. 2C) The substrate prepared by the above method was oxidized by 0.1 µm (203) in a steam of 1000 ° C.

(FIG. 2D) Surfaces of the above substrate and a 6-inch synthetic silica substrate 210 preliminarily prepared were plasma-processed in the same manner as in the first example.

(FIG. 2E) The above silicon substrate 200 and silica substrate 210 were immersed in pure water for five minutes, they were spin-dried thereafter, and then the processed surfaces thereof were bonded to each other. Subsequently, annealing was conducted at 300° C. for ten hours.

(FIG. 2F) First, the silicon substrate portion 200 having the thickness of 290 µm was etched by RIE under the same conditions as in Example 1. After the porous silicon layer 201 was exposed to the surface, the porous layer 201 was then selectively etched by the chemical dry etching also under similar conditions to those in Example 1. At this time the silica substrate 210 was not etched at all. The end point of etching can be determined utilizing the method for monitoring fluorescence from the etched surface, but control of etching time is sufficient because of the very large selectivity.

As a result, the SOI substrate was obtained with a silicon single-crystal thin film having the film thickness distribution of 98.2 nm±3.4 nm (±3.5%) on the silica substrate.

[Example 3]

The third example of the present invention will be explained in detail with reference to FIGS. 3A to 3F.

(FIG. 3A) A 5-inch p-type (100) silicon substrate 300 with resistivity of 0.01 Ω·cm having the thickness of 300 µm was prepared, and a porous layer 301 was formed only in the thickness of 5 µm from the surface thereof.

(FIG. 3B) An epitaxial layer 302 was formed in the thickness of 0.15 µm on the porous surface of the thus obtained substrate in the same manner as in the first example.

(FIG. 3C) The substrate prepared by the above method was processed under the condition of 900° C. in a steam ambiance, thereby obtaining an oxide film 303 of 0.05 µm.

(FIG. 3D) The above substrate 300 having the oxide film, and a support substrate (silicon wafer) 310 with a silicon dioxide film 0.2 µm thick preliminarily prepared were set in the parallel plate plasma processing system, and the surfaces of the respective substrates were activated under the oxygen plasma conditions similar to those in Example 1.

(FIG. 3E) The both substrates thus surface-processed were immersed in pure water for five minutes, they were spin-dried, and then the processed surfaces thereof were bonded to each other. After that, annealing was carried out at 400° C. for six hours.

(FIG. 3F) After annealing, the side of silicon substrate 300 was selectively etched under the below conditions in the parallel plate plasma etching system, similar to that described above, thereby exposing porous silicon 301.

RF frequency: 13.56 MHz

RF power: 1 kW

Flow rate of $CF_4$ gas: 800 sccm

Flow rate of Ar gas: 200 sccm

Pressure: 5 Pa

Substrate bias: 500 V

Processing time: 99 minutes to 102 minutes

The etch rate of non-porous silicon under the above conditions was 3.1 µm/min while that of porous silicon was 0.43 µm/min. Similarly as in Example 1, there is the variation of 300 to 305 µm in the worst case for the non-porous single-crystal substrate portion 300, and, for example, in the case of etching of 100 minutes, porous silicon will be overetched for 1.6 to 4.8 minutes. The etching thicknesses of underlying porous silicon 301 at this time are 0.69 µm and 2.1 µm, respectively, and even in the worst case, etching of porous silicon 301 of 5 µm can be stopped as leaving the thicknesses of 2.9 to 4.3 µm. Determination of this end point was carried out by monitoring the self-bias, and as an end point of etching of porous silicon, discharge was stopped when the self-bias became 900 V to 700 V. For six substrates set in the etching system, porous silicon of the all substrates was exposed over the entire surface, and in-wafer-plane distributions of remaining thicknesses thereof were within ±10%.

This substrate was then set in the microwave-excited chemical dry etching system to selectively etch only the porous portion 301. The etching conditions at this time were almost the same as in Example 1, but the substrate was heated and also vibrated by ultrasonic wave.

Microwave frequency: 1 GHz
Microwave power: 100 W
Flow rate of $SF_6$ gas: 100 sccm
Flow rate of $O_2$: 500 sccm
Flow rate of $N_2$: 500 sccm
Pressure: 100 Pa
Substrate temperature: 300° C.
Ultrasonic wave: 1 kW
Processing time: 10 minutes The etch rate of non-porous silicon under the above conditions was also approximately up to $5 \times 10^{-4}$ μm/min.

The effects of heating and ultrasonic vibration of substrate first promoted diffusion into pores of porous silicon, and also promoted physical disintegration due to etching of the walls of pores, thereby exposing almost all underlying epitaxial layer after 7 to 8 minutes from start, and completely etching the porous portion after 10 minutes. Even if this underlying epitaxial single-crystal silicon layer 302 were overetched for 10 minutes, the overetching thicknesses would be not more than 50 Å, which would not affect the uniformity achieved upon epitaxial growth. The end point of etching can be determined by utilizing the method for monitoring fluorescence from the etched surface, but control of the etching time is sufficient because of the very large selectivity.

As a result, the SOI substrate was obtained with an excellent ultra-thin single-crystal silicon film having the film thickness distribution of about 100.8 nm±3.4 (±3.4%) on the silicon dioxide film of 0.25 μm. [Example 4]

The fourth example of the present invention will be explained in detail with reference to FIGS. 4A to 4F.

(FIG. 4A) A 5-inch p-type (100) silicon substrate 400 with resistivity of 0.01 Ω·cm having the thickness of 300 μm was prepared, and a porous layer 401 was formed only in the thickness of 5 μm from the surface thereof.

(FIG. 4B) An epitaxial layer 402 was formed in the thickness of 0.15 μm on the porous surface of the obtained substrate in the same manner as in the first example.

(FIG. 4C) The substrate prepared by the above method was processed under the condition of 900° C. in a steam ambiance to obtain an oxide film 403 of 0.05 μm.

(FIG. 4D) The above substrate 400 having the oxide film, and a support substrate (silicon wafer) 410 with a silicon dioxide film 0.2 μm thick preliminarily prepared were set in the parallel plate plasma processing apparatus, and the surfaces of the respective substrates were activated under the oxygen plasma conditions similar to those in Example 1.

(FIG. 4E) The both substrates thus surface-processed were immersed in pure water for five minutes, they were then spin-dried, and thereafter their processed surfaces were bonded to each other. After that, annealing was carried out at 400° C. for six hours.

(FIG. 4F) After annealing, the side of silicon substrate 400 was selectively etched under the conditions of Example 3 in the parallel plate plasma etching apparatus similar to that described above, thereby exposing porous silicon 401. The etch rate of non-porous silicon under such conditions was 3.1 μm/min while that of porous silicon was 0.43 μm/min. Similarly as in Example 1, there is the variation of 300 to 305 μm in the worst case for the non-porous single-crystal substrate portion 400, and, for example, in the case of etching for 100 minutes, porous silicon will be overetched for 1.6 to 4.8 minutes. At this time, similarly as in Example 3, etching of porous silicon 401 of 5 μm can also be stopped as leaving the thicknesses of 2.9 to 4.3 μm even in the worst case. Determination of this end point was made by monitoring the self-bias, and as an end point of porous silicon etching, discharge was stopped when the self-bias became 900 V to 700 V.

This substrate was set in a light-excited $H_2$ radical generating system to selectively etch only the porous portion 401. Since the section for generating $H_2$ radicals is spatially separated from the section for carrying out etching and since no plasma is used in the case of light excitation, ion species do not reach the substrate. The etching conditions at this time were as follows.

Excitation light source: low pressure mercury lamp (253.7 eV)
Flow rate of $H_2$ gas: 100 sccm
Pressure: 10 Pa
Substrate temperature: 300° C.
Ultrasonic wave: 1 kW
Processing time: 30 minutes In this optically decomposed $H_2$ radical etching under the above conditions, the etch rate of non-porous silicon was also approximately up to $2 \times 10^{-4}$ μm/min.

The effects of heating and ultrasonic vibration of substrate first promoted diffusion into the pores of porous silicon and also promoted physical disintegration due to etching of the walls of pores, thereby exposing almost all underlying epitaxial layer after 20 minutes from start and completely etching the porous portion after 30 minutes. Even if the underlying epitaxial single-crystal silicon layer 402 were overetched for 10 minutes, the overetching thicknesses would be not more than 50 Å, which would not affect the uniformity achieved upon epitaxial growth. The end point of etching can also be determined utilizing the method for monitoring fluorescence from the etched surface, but control of etching time is sufficient because of the very large selectivity.

As a result, the SOI substrate was obtained with an excellent ultra-thin single-crystal silicon film having the film thickness distribution of about 99.8 nm ±3.6 (±3.6%) on the silicon dioxide film of 0.25 μm. [Example 5]

Figure 1A:
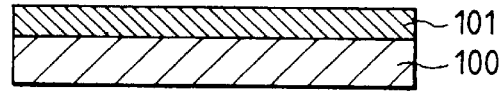
FIGS. 1A, 1B, 1C, 1D, 1E and 1F are schematic cross-sectional views for explaining an embodiment of the present invention and steps in the first example.
Figure 1B:
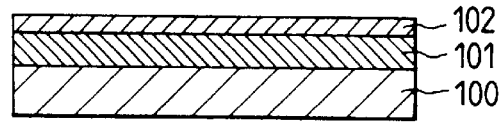
Figure 1C:
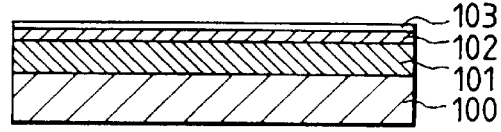
Figure 1D:
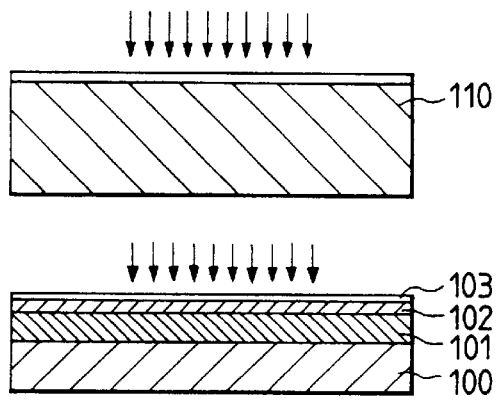
Figure 1E:
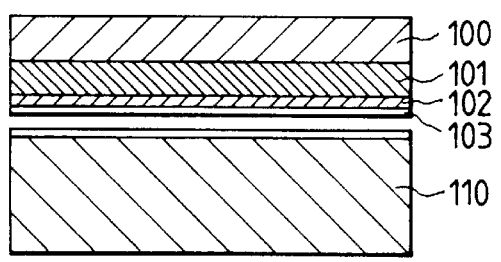
Figure 1F:
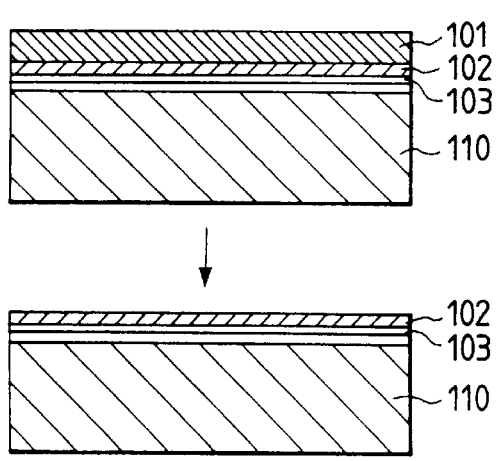
Figure 2A:
FIGS. 2A, 2B, 2C, 2D, 2E and 2F are schematic cross-sectional views for explaining steps in the second example of the present invention.
Figure 2B:
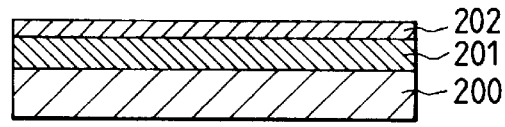
Figure 2C:
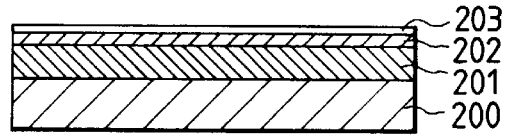
Figure 2D:
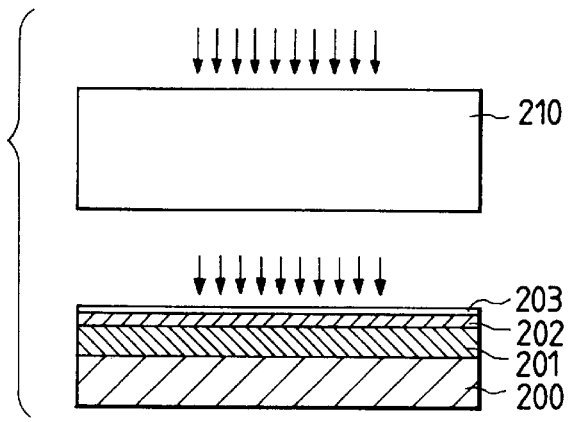
Figure 2E:
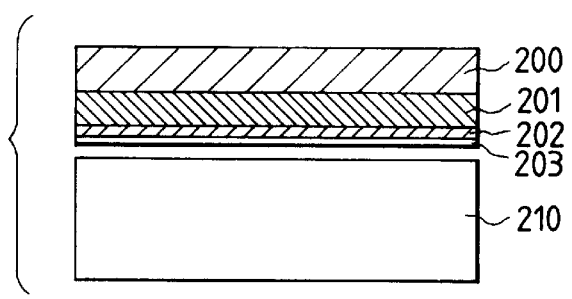
Figure 2F:
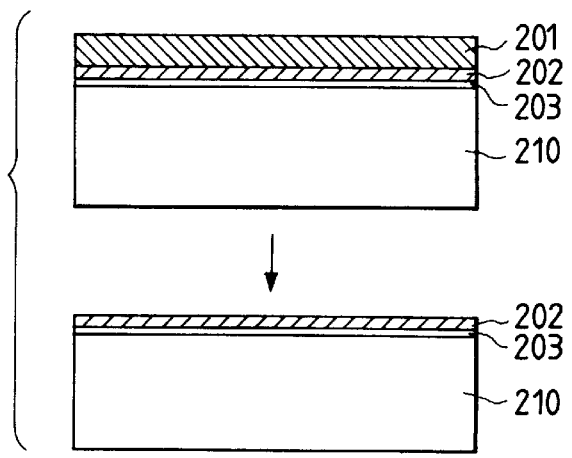
Figure 3A:
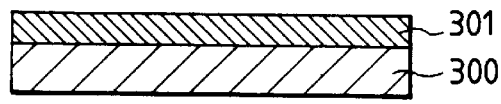
FIGS. 3A, 3B, 3C, 3D, 3E and 3F are schematic cross-sectional views for explaining steps in the third example of the present invention.
Figure 3B:
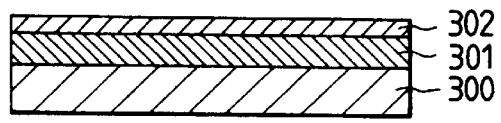
Figure 3C:
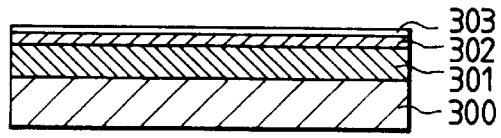
Figure 3D:
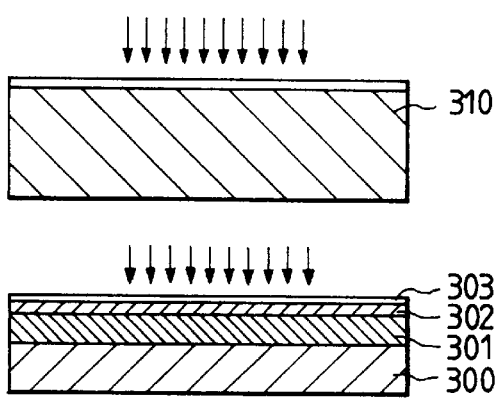
Figure 3E:
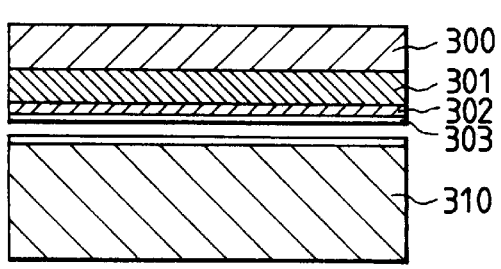
Figure 3F:
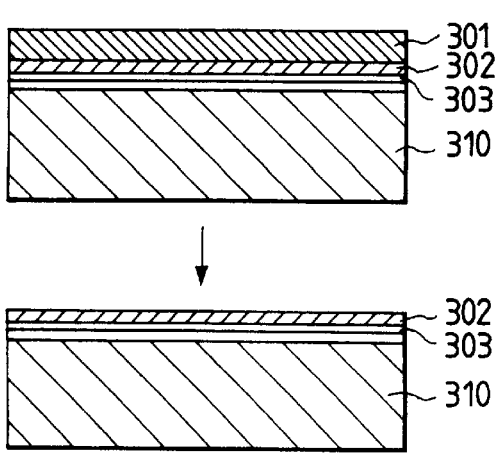
Figure 5:
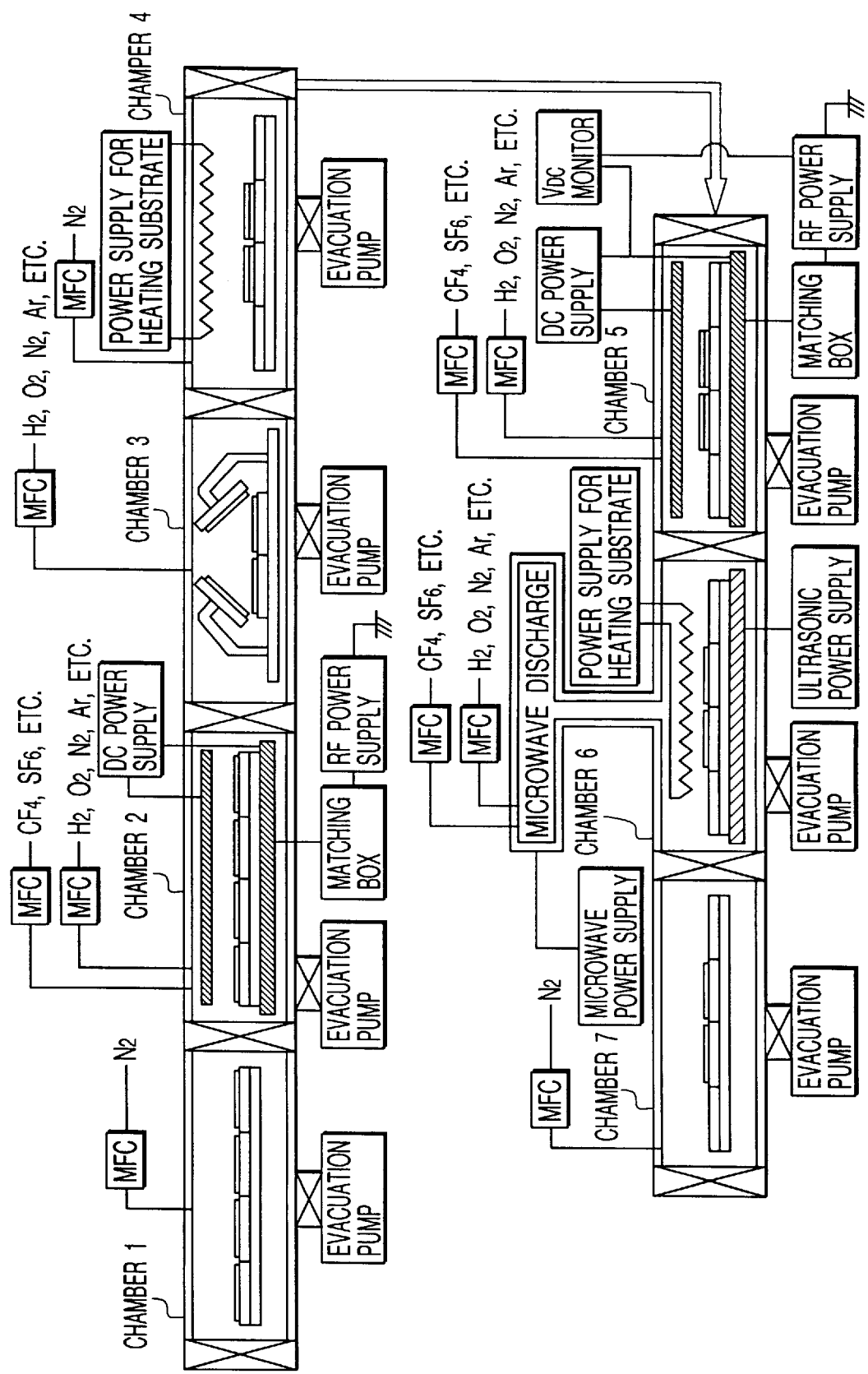
FIG. 5 is a schematic cross-sectional view for explaining the fabrication apparatus in the fifth example of the present invention.

FIG. 5 shows an embodiment of the fabrication apparatus of SOI substrate according to the present invention.

First, 5-inch p-type (100) silicon substrates with resistivity of 0.01 Ω·cm having the thickness of 300 μm were prepared similarly as in the previous examples, and a porous layer was formed in the thickness of 5 μm from the surface thereof. An epitaxial single-crystal silicon layer was formed in the thickness of 0.15 μm on the porous surface of the substrates thus obtained. Further, the substrates were processed under the condition of 900° C. in a steam ambiance to form an oxide film of 0.05 μm on the surface, they were then cleaned, and thereafter they were set in the apparatus of the present embodiment. Further, SOI support substrates having a silicon dioxide film 0.2 μm thick, which were to be bonded to the foregoing substrates, were also cleaned and thereafter were set in the apparatus of the present embodiment as well as the foregoing substrates.

In the apparatus of the present embodiment the substrates were first set on respective substrate holders for conveyance and then were carried into a load room of chamber 1 open to air. Then the load room was evacuated to a vacuum. Then a gate valve was opened in the vacuum of about $10^{-4}$ Pa and the substrates were moved to a surface activation room of chamber 2. Then the gate valve to the chamber 1 was closed and gas was introduced to perform the surface activation process under the following conditions.

RF frequency: 13.56 MHz
RF power: 300 W
Flow rate of $CF_4$ gas: 50 sccm
Flow rate of oxygen: 30 sccm
Pressure: 20 Pa
Processing time: 1 minute The above surface-activated substrates, after evacuation to a vacuum, were moved to a bonding room of chamber 3 and the activated surfaces were bonded to each other. Bonding was carried out in such conditions that $O_2$ and $N_2$ were introduced each at the same rate of 800 sccm and that under the pressure of about 400 Pa vacuum chucks were actuated to move the wafers from the substrate holders onto the associated substrates to press them. After that, the substrates were moved to an annealing room of chamber 4 and annealing was carried out at the flow rate of $N_2$ of 1000 sccm and under 400 Pa in an ambiance of annealing at 400° C. and for six hours.

After annealing, the gate valve was opened in the vacuum of 400 Pa and the substrates were moved to an etching room of chamber 5. Then the gate valve to the chamber 4 was closed, the chamber was evacuated to a vacuum, and then gas was introduced to perform the first etching process under the following conditions.

RF frequency: 13.56 MHz
RF power: 1 kW
Flow rate of $CF_4$ gas: 100 sccm
Flow rate of Ar gas: 200 sccm
Pressure: 7 Pa
Substrate bias: 800 V
Determination of end point: monitoring DC voltage between substrates Etching in this chamber 5 was of the RIE mode in the parallel plate plasma etching apparatus similar to that in the previous examples, and the crystal silicon wafer portion was etched selectively and at high speed to expose porous silicon. The etch rate of non-porous silicon under the above conditions in this apparatus was 5.1 $\mu$m/min while that of porous silicon was 0.33 $\mu$m/min. Similarly as in the other examples, the maximum variation of thickness of the non-porous single-crystal substrate portion was 5 $\mu$m, and after exposure of porous silicon it was overetched with variation of about one minute. However, since the etch rate of porous silicon is low, etching of porous silicon of 5 $\mu$m can be stopped in variation of remaining thickness of not more than 0.5 $\mu$m. This end point was determined by monitoring the self-bias, and as an end point of porous silicon etching, discharge was stopped when the self-bias became 900 V to 700 V.

Next, the substrates were moved to an etching room of chamber 6 as evacuated to a vacuum. This etching chamber is a microwave-excited chemical dry etching system and is constructed in the structure capable of heating the substrates and capable of applying ultrasonic vibration to the substrates. This enables only the porous silicon portion to be etched selectively. The etching conditions at this time were as follows.

Microwave frequency: 1 GHz
Microwave power: 200 W
Flow rate of $SF_6$ gas: 200 sccm
Flow rate of $O_2$: 500 sccm
Flow rate of $N_2$: 500 sccm
Pressure: 100 Pa
Substrate temperature: 300° C.

Ultrasonic wave: 1 kW
Processing time: 10 minutes

The etch rate of non-porous silicon under the above conditions was also about up to $5 \times 10^{-4}$ $\mu$m/min. The effects of heating and ultrasonic vibration of substrate first promoted diffusion into the pores of porous silicon and also promoted physical disintegration due to etching of the walls of pores, so that almost all underlying epitaxial layer was exposed after 7 to 8 minutes from start and the porous portion was completely etched after 10 minutes. Even if this underlying epitaxial single-crystal silicon layer were overetched for 10 minutes, the overetch thicknesses would be not more than 50 Å, which would not affect the uniformity achieved upon epitaxial growth. The end point of etching may be determined utilizing the method for monitoring fluorescence from the etched surface, but control of etching time is sufficient because of the very large selectivity.

Finally, the substrates were moved to an unload room of chamber 7, then the unload room was made open to the air, and the SOI substrates thus obtained were taken out.

Since the SOI substrates fabricated by the fabrication apparatus of the present embodiment were conveyed through the vacuum chambers, the substrates were free, especially, of deposition of impurities and particles upon bonding and of voids caused thereby. The fabrication apparatus of the present example is of the in-line type and can process many substrates. For example, the apparatus can fabricate SOI substrates with an excellent ultra-thin single-crystal silicon film in the film thickness distribution of about 97.8 nm ±3.8 (±3.9%) on the silicon dioxide film of 0.25 $\mu$m with good controllability and enables the cost to be reduced by mass production.

What is claimed is:

1. A process of fabricating a SOI substrate comprising:

a step of preparing a substrate having a non-porous single-crystal Si region over a surface of a porous single-crystal Si region;

a step of bonding a support substrate to a surface of said non-porous single-crystal Si region of said substrate; and a step of removing said porous single-crystal Si region;

wherein said step of removing said porous single-crystal Si region comprises a step of performing radical etching in which an etch rate of the porous single-crystal Si region is greater than that of the non-porous single-crystals Si region.

2. A process of fabricating a SOI substrate according to claim 1, wherein said step of removing said porous single-crystal Si region is a step of etching the porous region from inside in such a way that activated radical species resulting from decomposition by at least electric or optical energy intrude into pores of the porous region to etch the porous region from inside thereof.

3. A process of fabricating a SOI substrate according to claim 1, wherein said step of removing said porous single-crystal Si region comprises a step of heating or vibrating an etching substrate.

4. A process of fabricating a SOI substrate according to claim 1, further comprising a step of removing said single-crystal Si substrate after the bonding step, and a step of employing at least a portion of the removed single-crystal Si substrate as said single-crystal Si substrate having at least the porous single-crystal Si region.

5. A process of fabricating a SOI substrate comprising:
- a step of preparing a substrate having a non-porous single-crystal Si region over a surface of a porous single-crystal Si region;
- a step of bonding a support substrate to a surface of said non-porous single-crystal Si region of said substrate; and
- a step of removing said porous single-crystal Si region; wherein said step of removing said porous single-crystal Si region comprises a step of etching said porous single-crystal Si region in a chemical radical-etching mode wherein the etching proceeds isotropically.

6. A process of fabricating a SOI substrate according to claim 1 or 5, wherein said bonding step is carried out by bonding said substrate and said support substrate to each other through an insulating region.

* * * * *

UNITED STATES PATENT AND TRADEMARK OFFICE
CERTIFICATE OF CORRECTION

PATENT NO.    : 5,876,497
DATED         : March 2, 1999
INVENTOR(S)   : TADASHI ATOJI It is certified that error appears in the above-identified patent and that said Letters Patent is hereby corrected as shown below:

Title page,
AT [21] APPLICATION NO.

"762,595" should read --08/762,595.--

AT [56] REFERENCES CITED

OTHER PUBLICATIONS

""Exytremely" should read --"Extremely--.

AT [57] ABSTRACT

Line 7, "comprises" should read --comprising--.

IN THE DRAWINGS

Sheet 5, FIG. 5, "CHAMPER 4" should read --CHAMBER 4--.

COLUMN 4

Line 40, "¶ that" should read --that--.

COLUMN 7

Line 21, "conc" should read --conc.--

UNITED STATES PATENT AND TRADEMARK OFFICE
CERTIFICATE OF CORRECTION

PATENT NO. : 5,876,497
DATED : March 2, 1999
INVENTOR(S) : TADASHI ATOJI It is certified that error appears in the above-identified patent and that said Letters Patent is hereby corrected as shown below:

COLUMN 13

Line 35, "180 $\mu$nm ±5.4 (±3%)" should read --180 nm ±5.4 (±3%)--.

Signed and Sealed this

Twenty-sixth Day of December, 2000

Attest:

Q. TODD DICKINSON

*Attesting Officer*        *Director of Patents and Trademarks*